(12) United States Patent
Iida

(10) Patent No.: US 6,798,326 B2
(45) Date of Patent: Sep. 28, 2004

(54) INDUCTOR ELEMENT AND INTEGRATED CIRCUIT EMPLOYING INDUCTOR ELEMENT

(75) Inventor: Sachio Iida, Chiba (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/208,638

(22) Filed: Jul. 30, 2002

(65) Prior Publication Data

US 2003/0030532 A1 Feb. 13, 2003

(30) Foreign Application Priority Data

Aug. 1, 2001 (JP) ........................................ 2001-234143

(51) Int. Cl.⁷ ................................................ H01F 5/00
(52) U.S. Cl. ...................... 336/200; 336/223; 336/232
(58) Field of Search ................................. 336/200, 223, 336/232, 83; 29/602.1; 257/531

(56) References Cited

U.S. PATENT DOCUMENTS

| | | | | |
|---|---|---|---|---|
| 4,816,784 A | * | 3/1989 | Rabjohn | 333/24 R |
| 6,388,549 B1 | * | 5/2002 | Lenhard | 336/200 |
| 6,476,704 B2 | * | 11/2002 | Goff | 336/200 |
| 6,559,751 B2 | * | 5/2003 | Liu et al. | 336/223 |
| 6,577,219 B2 | * | 6/2003 | Visser | 336/200 |
| 6,608,364 B2 | * | 8/2003 | Carpentier | 257/531 |

* cited by examiner

*Primary Examiner*—Anh Mai
(74) *Attorney, Agent, or Firm*—Frommer Lawrence & Haug LLP; William S. Frommer; Bruno Polito

(57) ABSTRACT

An inductor element is formed by helically winding a first conductor and a second conductor by causing both conductors to hold on the condition in parallel to each other. In this case, by causing the first conductor to intersect the second conductor at a predetermined position to replace individual positions. By virtue of this arrangement, individual length of the first and second conductors substantially equal to each other, whereby forming up such an inductor element characterized by less loss of current and higher Q values.

6 Claims, 10 Drawing Sheets

$$Qdiff = \frac{Im(Z_{11}-Z_{21}-Z_{12}+Z_{22})}{Re(Z_{11}-Z_{21}-Z_{12}+Z_{22})}$$

40

ND ITEGRATED CIRCUIT EMPLOYING INDUCTOR ELEMENT

CROSS REFERENCE TO RELATED APPLICATIONS

The present document is based on Japanese Priority Document JP2001-234143, filed in the Japanese Patent Office on Aug. 1, 2001, the entire contents of which being incorporated herein by reference.

BACKGROUND OF THE INVENTION

1. Field of the Invention

The present invention relates to an inductor element formed on a plane mounted on an integrated circuit used for an electronic apparatus such as a mobile communications apparatus for example, and yet, the present invention also relates to an integrated circuit employing the inductor element of the present invention.

2. Description of the Related Art

Conventionally, an inductor element is formed on a plane inside of a semiconductor integrated circuit so that aimed circuits can be formed thereon. Taking an amplifier 100 formed as a semiconductor integrated circuit shown in FIG. 1 for example, a pair of inductor elements 103 and 104 is respectively employed for a pair of matching circuits 101 and 102 constituting a part of this amplifier 100.

In order to properly maintain characteristics of the amplifier and save power consumption thereof, it is essential for the above inductor elements 103 and 104 to exhibit smaller loss. In other words, the inductor elements 103 and 104 are individually required to have a higher Q value.

For example, the Japanese Patent Application Publication Laid-Open No. 2000-357774 discloses an inductor element employed in for such a semiconductor integrated circuit as cited above. The inductor element disclosed in the above-cited patent publication is formed with a pair of conductors 111 and 112 aligned in parallel to each other on an substrate as shown in FIG. 2 for example, where a pair of conductors are connected together at terminals 114 and 115.

Focusing on the skin effect in which density of high-frequency current flowing through conductor is intense at a surface of the conductor, by applying a plurality of conductors such as a pair of conductors 111 and 112 for example, it is so arranged that the inductor element shown in FIG. 2 can decrease high frequency resistance inside of these conductors.

Nevertheless, as shown in FIG. 2, in the case of forming an inductance element by helically winding a plurality of conductors aligned in parallel to each other repeatedly in the same direction, length of the outer conductors becomes longer than the inner conductors. The longer the length of conductors, the higher the high-frequency resistance of those outer conductors. Accordingly, current flowing through the first conductor 111 positioned outside decreases.

FIG. 3 shows a result of an analytical simulation on the electromagnetic field of the inductor element shown in FIG. 2. Length of an arrow mark on the first conductor 111 and the second conductor 112 shown in FIG. 3 represents current density.

As shown in FIG. 3, length of the arrow mark designating current density shown in the first conductor 111 positioned outer side is mostly shorter than the arrow mark designating current density shown on the adjoining second conductor 112 positioned inner side. This clarifies that a less amount of current flows through the first conductor than that flows through the second conductor.

Accordingly, in the case of the inductance elements as shown in FIGS. 2 and 3, although a pair of conductors are employed, neither of these can fully exert the effect of decreasing high-frequency resistance, and consequently, power consumption by an integrated circuit employing the above inductor element increases.

Accordingly, the present invention provides an inductor element capable of decreasing high-frequency resistance and loss and preserving a high Q value, and yet, also provides an integrated circuit formed by employing the inductor element of the present invention.

SUMMARY OF THE INVENTION

The present invention provides an inductor element comprising a plurality of conductors which are formed in mutually parallel relationship and helically wound within a plane on a surface of a substrate, which is employed as a high-frequency path to enable high-frequency current of an identical phase to flow through the plurality of conductors. By way of crossing the plurality of conductors at a predetermined position, inner positions and outer positions of the plurality of conductors are inverted from each other. The predetermined position is so selected that individual length of the plurality of conductors can become substantially equal to each other.

According to the present invention, by way of substantially equalizing individual length of a plurality of conductors, resistance value of these plural conductors is substantially equalized. Therefore, it is made possible to equalize density of current flowing through the plurality of conductors as much as possible. By virtue of this arrangement, it is possible to realize such an inductor element featuring least loss, high Q value, and satisfactory physical characteristics. Such an inductor element realized by the present invention is suitable for application to an integrated circuit.

DETAILED DESCRIPTION OF THE INVENTION

Referring now to the accompanying drawings, an embodiment of an inductor element formed on a plane and an integrated circuit employing the inductor element according to the present invention is described below.

First Embodiment

Figure 4:
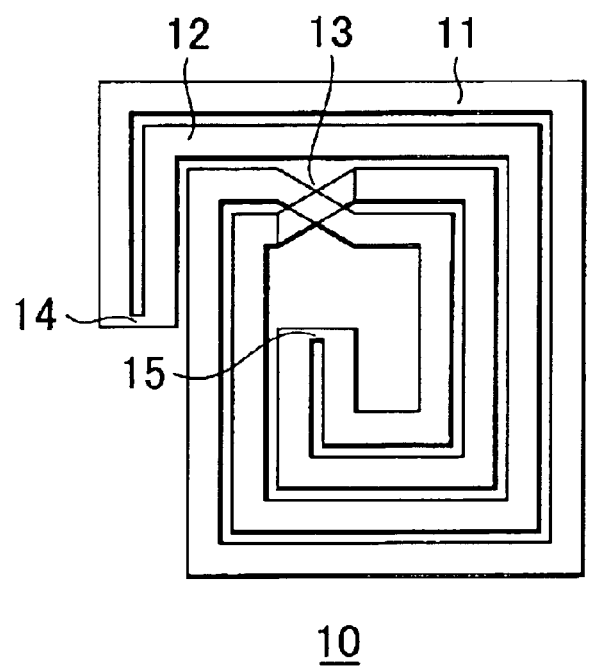
FIG. 4 is a view showing an embodiment of an inductor element according to the present invention.

FIG. 4 shows a plan view for explanatory of an inductor element 10 according to the first embodiment of the present invention. As shown in FIG. 4, the inductor element 10 is formed by arranging a first conductor 11 and a second conductor 12 in parallel to each other. The first and second conductors 11 and 12 are helically wound inside of the plane.

Further, as shown in FIG. 4, in the inductor element 10, the first and second conductors 11 and 12 cross each other at an intersection 13 to invert individual positions from each other to internally position the first conductor 11 placed on the outer side and externally position the second conductor 12 placed on the inner side. Accordingly, individual length of the first and second conductors 11 and 12 are made substantially equal. Further, as shown in FIG. 4, the first and second conductors 11 and 12 are connected together at a first terminal 14 and a second terminal 15.

Figure 5:
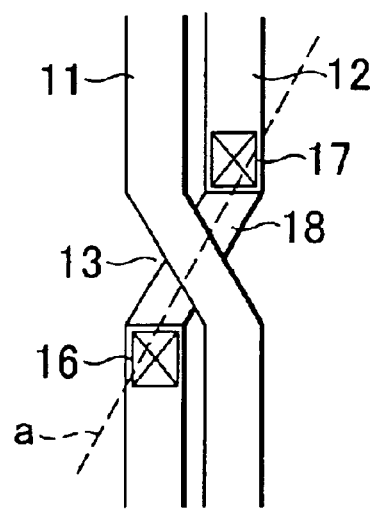
FIG. 5 is a view for explaining the intersection 13 provided inside of the inductor element shown in FIG. 4.

FIG. 5 is an enlarged view showing the intersection 13 and a peripheral portion thereof the inductor element 10. As shown here, the first conductor 11 replaces own position with that of the second conductor 12 by causing the second conductor 12 to cubically cross the first conductor 11 by way of jumping it across a pair of VIAs 16 and 17 and another conductor 18 of the lower layer.

Figure 6:
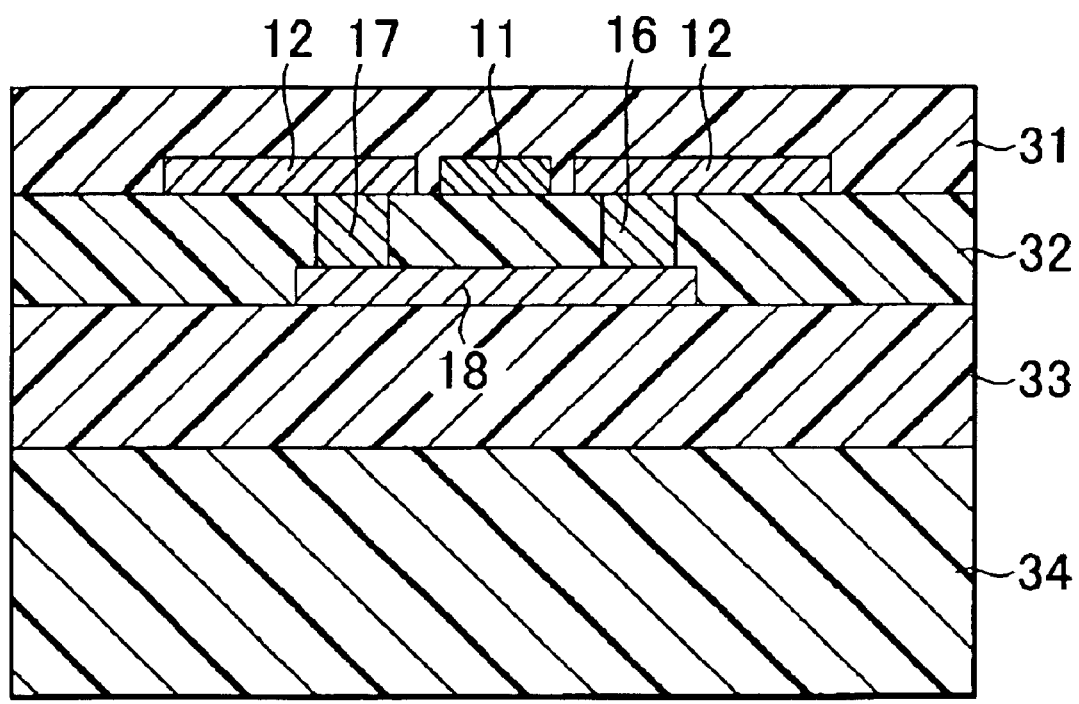
FIG. 6 is a cross sectional view of the intersection 13 for explaining the constitution of the intersection 13 provided inside of the inductor element shown in FIG. 4.

Referring now to FIG. 6, constitution of the intersection 13 is described below. FIG. 6 is a cross-sectional view of the inductor element 10 at a position shown by a dotted line "a" in FIG. 5. As shown in FIG. 5 via the dotted line "a", since the inductor element 10 is obliquely cut, lateral width of the first and second conductors 11 and 12 seems to be different from each other. However, actually, width and thickness of the first and second conductors 11 and 12 are exactly identical to each other.

As shown in FIG. 6, the first and second conductors 11 and 12 are respectively formed on a second interlayer film 32 which is an insulator. The surfaces of both conductors are covered with a surface protecting film 31. Interface between the second conductor 12 and the under-layer conductor 18 for jumping is linked with each other by the electrically conductive VIAs 16 and 17. The under-layer conductor 18 for jumping is insulated from a silicon substrate 34 by a first inter-layer film 33.

Raw material of individual components is described below. The first and second conductors 11 and 12 and the under-layer conductor 18 individually comprise aluminum (Al) wiring comprising diffused barrier layers composed of titanium/titanium-nitride (Ti/TiN), laminated on and under an alloy layer comprising aluminum (Al), aluminum and copper (Al—Cu), or aluminum, silicon, and copper (Al—Si—Cu), for example.

The above-referred VIAs 16 and 17 are via-plugs formed by covering periphery of aluminum (Al) or tungsten (W) with diffused barrier layers composed of titanium nitride (TiN) for example. The VIAs 16 and 17 enable inter-layers of the above conductors 11 and 12 to be electrically linked with each other. The first and second inter-layer films 33 and 32 are composed of an insulating film made from silicon oxide. The above referred surface protecting film 31 is composed of phosphosilicate glass (PSG) film. The above-referred silicon substrate 34 is a P-type silicon substrate. It is noted that the materials are not limited to those recited above and another materials may be used as far as they are appropriate.

Figure 7:
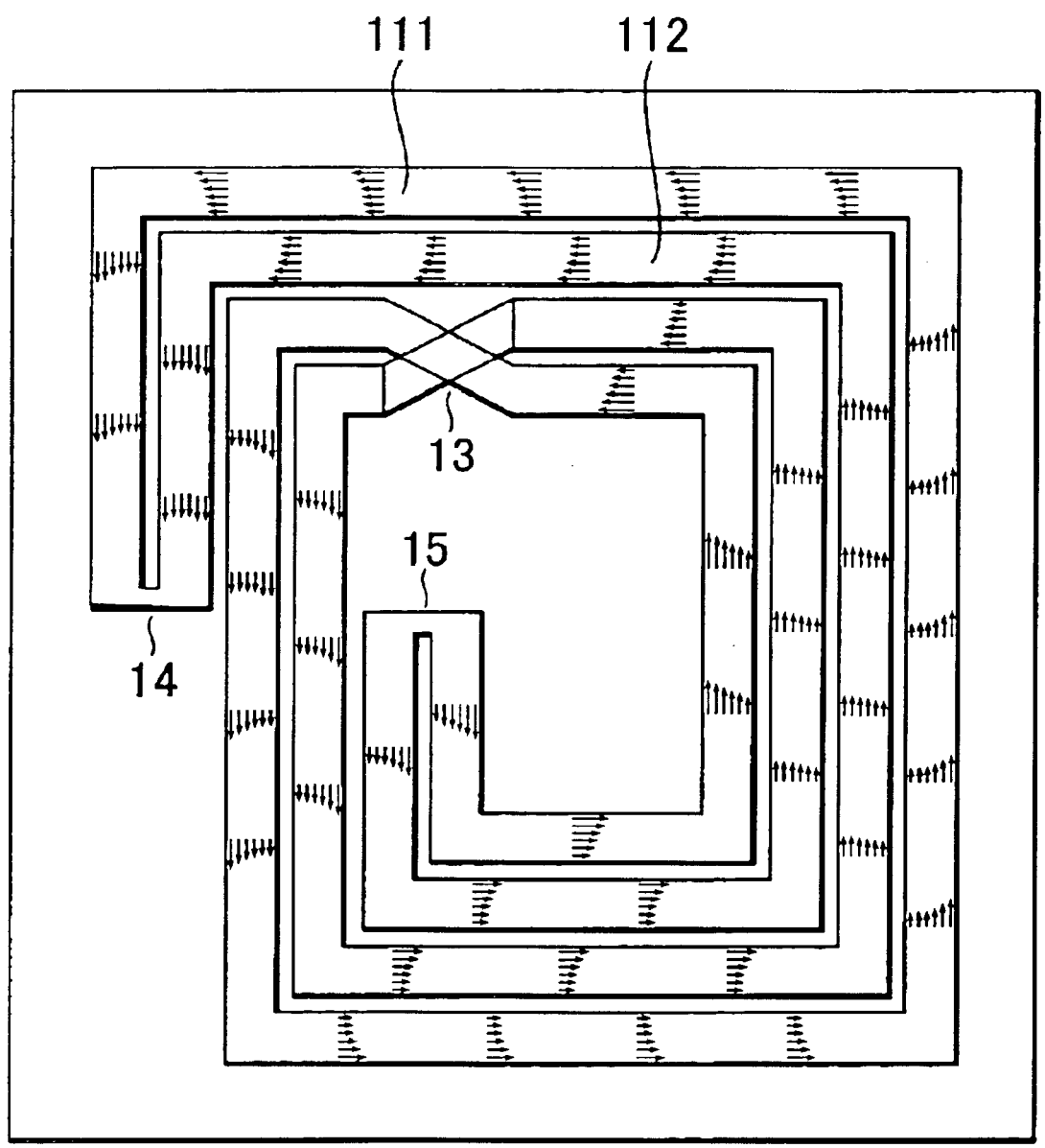
FIG. 7 is a view of showing a result of measuring density of current flowing through individual conductors provided for the inductor element 10 shown in FIG. 4.

FIG. 7 is a result of seeking density of high-frequency current in the first and second conductors 11 and 12 by simulating electromagnetic field when applying high-frequency current to the inductor element 10 after equalizing length of the first and second conductors 11 and 12 by inverting planar-directional positions of both conductors via provision of the intersection 13.

Figure 3:
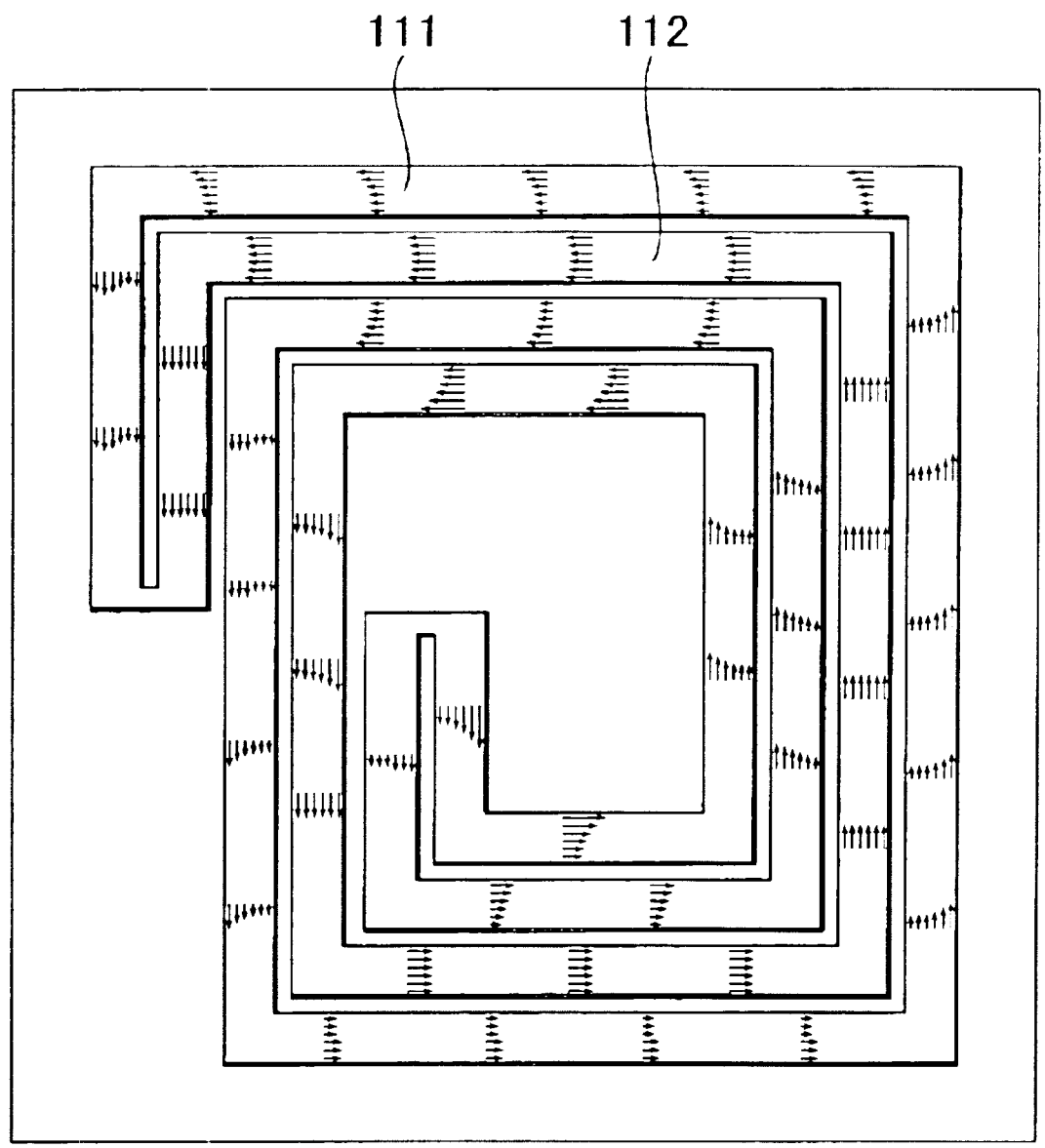
FIG. 3 is a view showing a chart for designating a result of measuring density of current flowing through individual conductors provided for the inductor elements shown in FIG. 2.

Similar to the case of FIG. 3, in FIG. 7, length of arrow marks on both conductors shows current density. As is obvious from comparison between the chart shown in FIG. 7 and another chart shown in FIG. 3 for designating a result of simulating electromagnetic field against a conventional inductor element without an intersection, the inductor element 10 shown in FIG. 7 proves that there is less difference of current density between the adjoining first and second conductors 11 and 12.

As described above, by way of initially providing the intersection 13 and then replacing positions of the first and second conductors 11 and 12 by crossing them, length of the first and second conductors 11 and 12 can be equalized substantially. By virtue of this arrangement, it is possible to realize an inductor element capable of minimizing high-frequency resistance and loss, and yet, preserving a high Q value.

Second Embodiment

Figure 8:
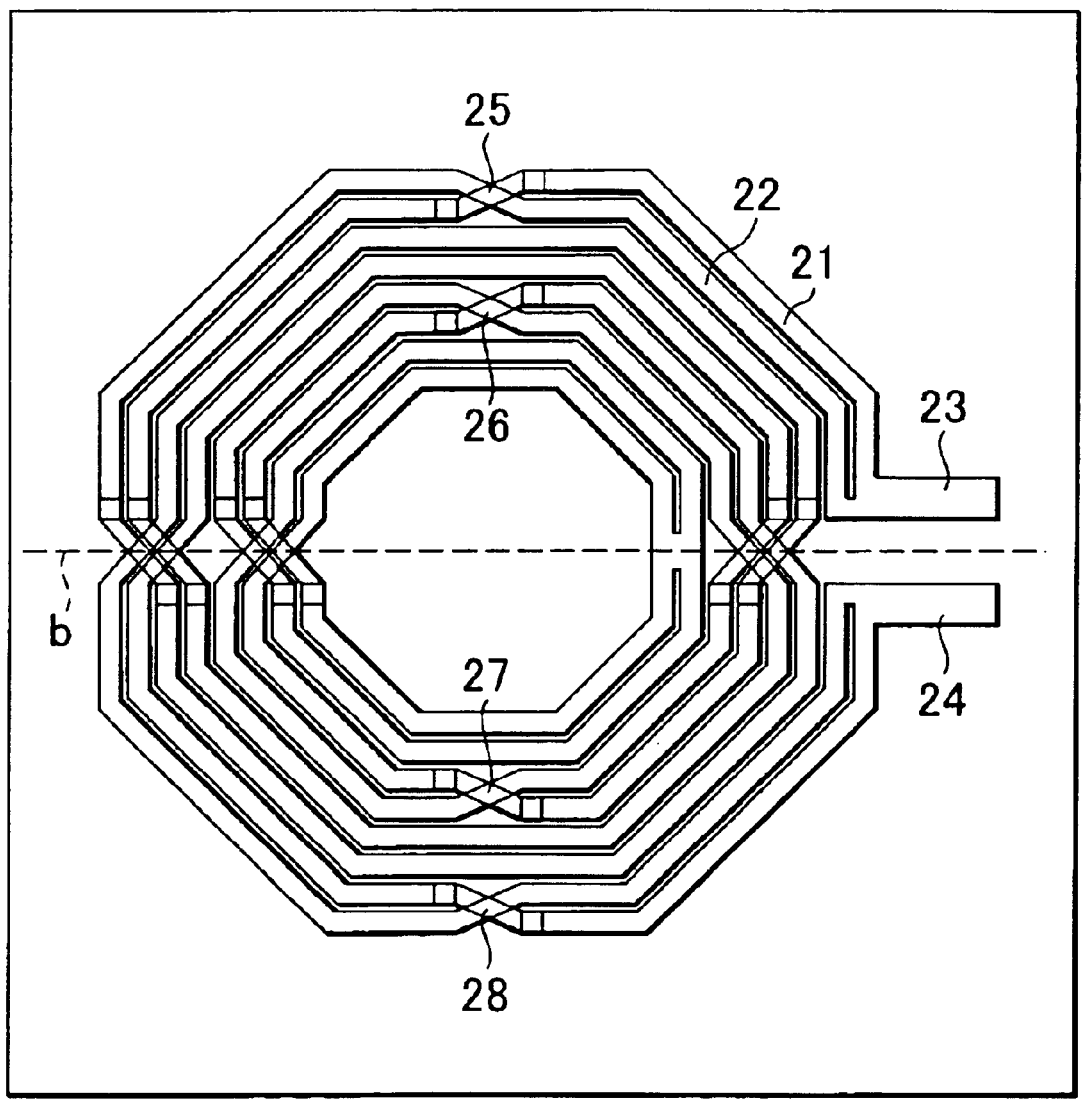
FIG. 8 is a view showing another embodiment of an inductor element 20 according to the present invention.

FIG. 8 is a plan view for explaining an inductor element 20 according to the second embodiment of the present invention. As is provided for the inductor element according to the first embodiment of the present invention, the inductor element 20 according to the second embodiment is also formed on a plane.

As shown in FIG. 8, the inductor element 20 is so formed that the upper portion and the lower portion are symmetrically positioned in relation to a dotted line "b" as an axis of symmetry. In a case of a semiconductor integrated circuit employing a silicon substrate, in many cases, such a differential circuit comprising a pair of symmetrically positioned circuit elements such as transistors containing identical physical characteristics is employed. Because of this reason, symmetric inductor element 20 as shown in FIG. 8 is required.

As is provided for the inductor element 10 related to the first embodiment, the symmetric inductor element 20 positions a pair of conductors including a first conductor 21 and a second conductor 22 in parallel, which are respectively wound inside of a plane. The first and second conductors 21 and 22 are connected together at first and second terminals 23 and 24.

In order to make the inductor element 20 symmetrize in relation to the dotted line "b" as the axis of symmetry, the first and second terminals 23 and 24 are positioned on the same side. The inductor element 20 have a specific point at which both the first and second conductors 21 and 22 intersect across the dotted line "b". More particularly, a pair of conductors extended from the first terminal 23 intersects another pair of conductors extended from the second terminal 24. This intersection does not correspond to the intersection 13 formed in the first embodiment at which the first conductor intersects the second conductor.

As described above, the portion at which the conductors intersect themselves across the reference dotted line "b" shown in FIG. 8 is inevitably generated by winding the conductors. Even though such a portion at which conductors intersect themselves across the reference dotted line "b", in consequence, like the preceding inductor element 10 shown in FIG. 4, the inductor element 20 is also formed by helically winding conductors.

In specific, despite of a difference in terms of the number of turns of winding up the conductors and presence or absence of symmetrical formation, the preceding inductor element 10 provided for the first embodiment shown in FIG. 4 and the present inductor element 20 provided for the second embodiment are constituted in a substantially similar way with helical formation.

In the constitution of the inductor element 20, four intersections 25, 26, 27, and 28, are formed in order to cause the first conductor 21 to intersect the second conductor 22 and replace the position of the first conductor 21 with that of the second conductor 22.

Unlike the intersection at which two pairs of conductors jointly intersect themselves across the dotted line "b", these intersections 25, 26, 27 and 28 are made by way of causing the first conductor to intersect the second conductor, position of the first conductor is replaced with that of the second conductor, in other words, the outer conductor is replaced with the inner conductor in order that the length of the first and second conductors can be equalized substantially.

More particularly, like the intersection 13 of the preceding inductor element 10 described earlier by referring to FIGS. 5 and 6, either of the first conductor 21 and the second conductor 22 to jump the other conductor at those intersections 25, 26, 27, and 28 to intersect the other one cubically.

In a case of the inductor element 20 shown in FIG. 8, the upper portion and the lower portion are symmetrically formed in relation to the dotted line "b" as the axis of symmetry. According to this arrangement, the intersection 25 of the upper portion is positioned in symmetry with the intersection 28 of the lower portion in relation to the dotted line "b". Likewise, the intersection 26 of the upper portion is positioned in symmetry with the intersection 27 of the lower portion in relation to the dotted line "b".

Figure 9:
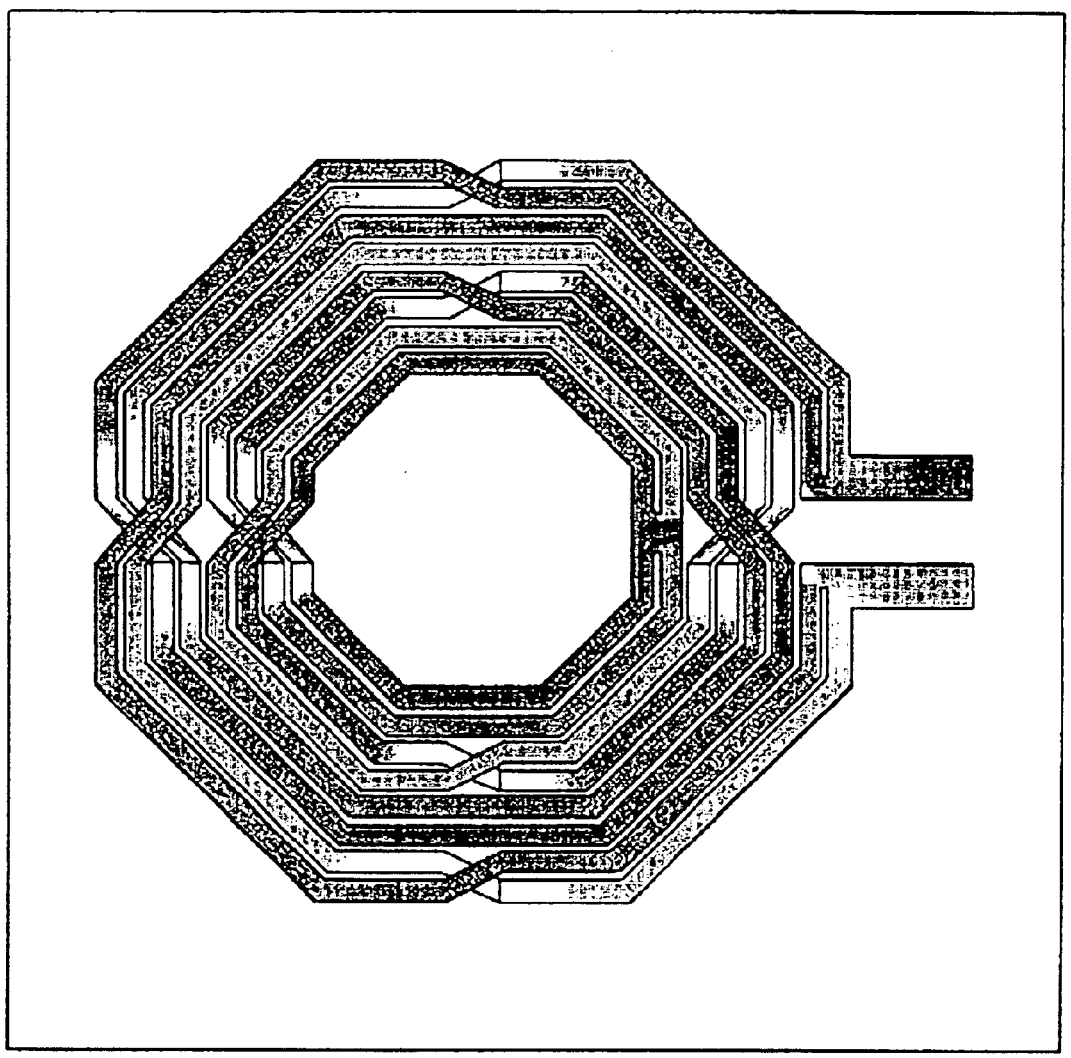
FIG. 9 is a view of showing a result of measuring density of current flowing through individual conductors provided inside of the inductor element 20 shown in FIG. 8.
Figure 10:
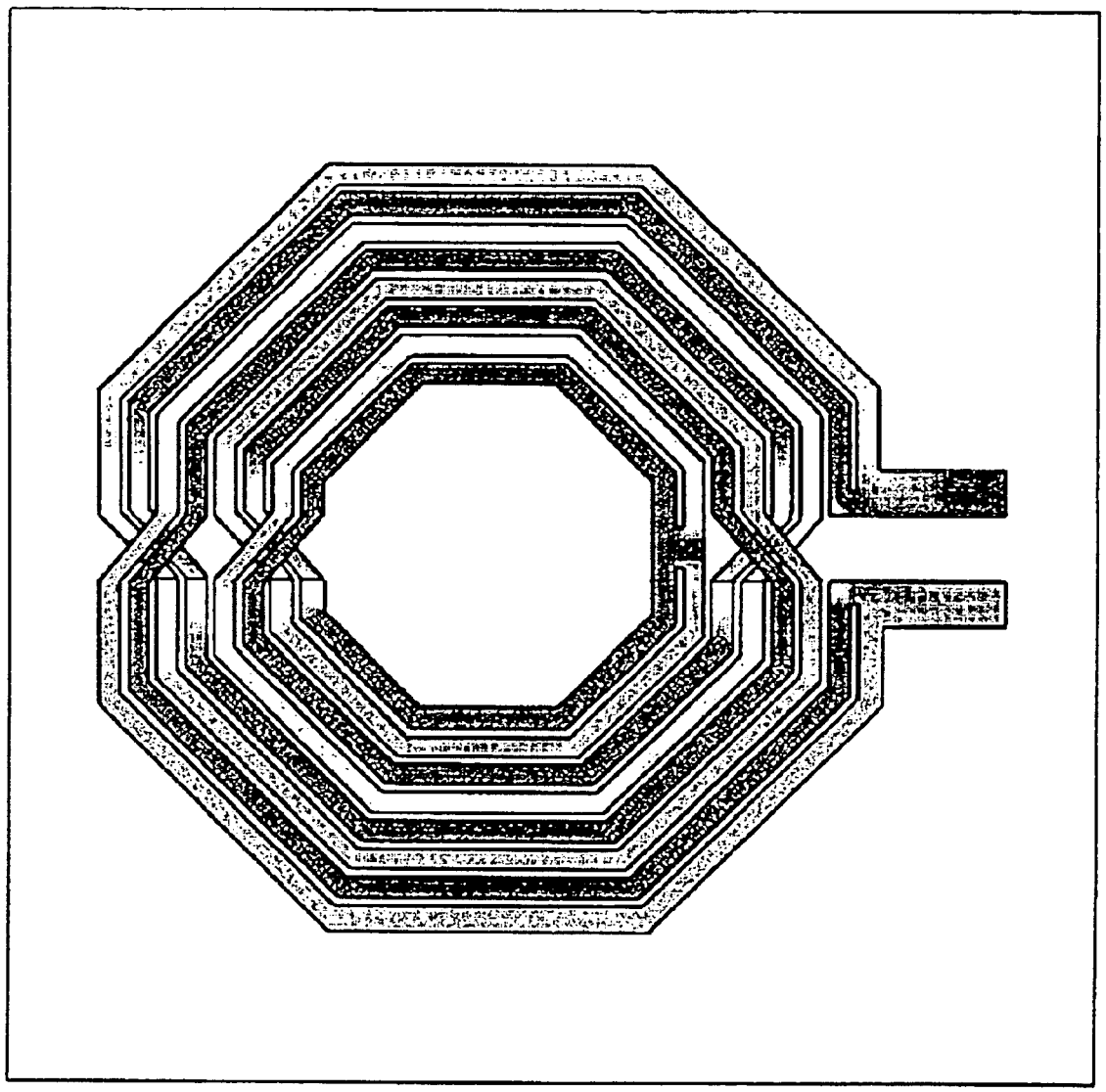
FIG. 10 is a view showing a result of measuring density of current flowing through individual conductors without an intersection of adjoining conductors.

FIG. 9 is a view density of high-frequency current when the high-frequency current is transmitted to the symmetric inductor element 20 provided with the above-referred intersections 25, 26, 27, and 28 for causing the first conductor 21 and the second conductor 22 to intersect each other as shown in FIG. 8. FIG. 10 is a view density of high-frequency current when the high-frequency current is transmitted to a symmetric inductor element without a portion for allowing a pair of adjoining conductors positioned in parallel to intersect each other. In FIGS. 9 and 10, shading of the conductors indicates current density.

In a case of the inductor element without the intersection portion as shown in FIG. 10, it is understood that the outer conductor is lightly shaded and the inner conductor is deeply shaded. In the other words, in the case of the inductor element shown in FIG. 10, it is understood that density of current flowing through the outer conductor is lower than that flows through the inner conductor. This is because, as described earlier, since length of the outer conductor is longer than that of the inner conductor, high-frequency resistance value has grown. In consequence, the inductor element shown in FIG. 10 is proved to generate much loss and a lower Q value.

On the other hand, in a case of the inductor element 20 shown in FIG. 9, unlike the case of the inductor element shown in FIG. 10, such obvious difference of shading does not appear, and thus, it is confirmed that difference of current density between the first conductor 21 and the second conductor 22 is minimized.

As is obvious from the above description, in the case of the symmetric inductor element 20 having the intersections 25, 26, 27, and 28 for enabling the first and second conductors 21 and 22 to cross each other, by way of substantially equalizing the length of the first and second conductors 21 and 22, it is possible to approximate high-frequency resistance values of the first and second conductors 21 and 22. Accordingly, the present invention makes it possible to realize the symmetric inductor element featuring less loss and a high Q value.

Next, differential Q values of the inductor element of the present invention having intersections for allowing an intersection of adjoining conductors shown in FIG. 9 and the inductor element without intersections for allowing intersection of adjoining conductors shown in FIG. 10 are described below. It should be understood that the term "differential Q value" corresponds to a Q value in a case of measuring circuit impedance via a differential signal, and thus, the differential Q value differs from a Q value in a case of measuring it via a single-phase signal as in the case of a conventional vector network analyzer.

Figures 11, 12:
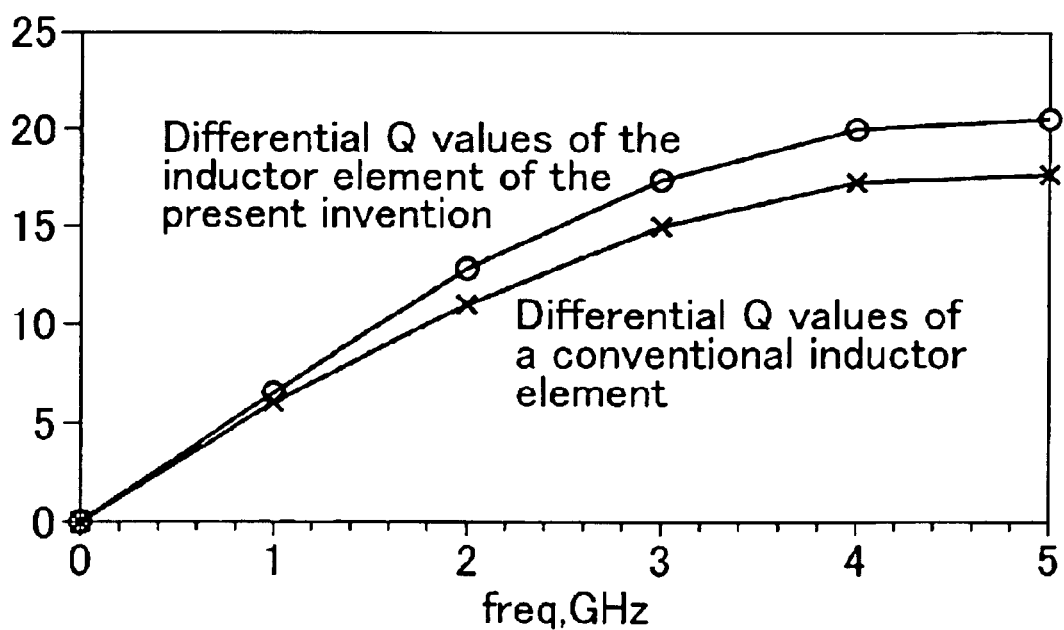
FIG. 11 is an arithmetic expression for calculating a differential Q value.
FIG. 12 is a graph showing a differential Q value of the inductor element of the present invention and another differential Q value of an inductor element without the intersection of adjoining conductors.

For example, it is possible to establish an arithmetic expression for calculating a differential Q value (Qdiff) from a single phase two-port impedance value by applying an expression shown in FIG. 11. FIG. 12 graphically shows a chart plotting the above differential Q value generated by the inductor element of the present invention having intersections and another differential Q value of a conventional inductor element without intersections. In FIG. 12, the horizontal axis represents frequencies (GHz), whereas the vertical axis represents the differential Q values.

As shown in FIG. 12, the curve plotted with plural circles ○ denotes actual differential Q values generated by the inductor element of the present invention, whereas the other curve plotted with plural crosses X denotes actual differential Q values generated by a conventional inductor element without the intersections. Further, as shown in FIG. 12, it is confirmed that the differential Q values of the inductor element of the present invention having intersections for allowing intersection of adjoining conductors are respectively higher by approximately 10% than those differential Q values of the conventional inductor element without the intersections.

As described above, by way of minimizing differential current of high-frequency current between an outer conductor and an inner conductor normally generated in the case of forming an inductor element by employing a plurality of conductors, it is possible to form an inductor element featuring the less loss and high Q values.

Next, an integrated circuit formed by employing the inductor element of the present invention is described below.

First, an example of an integrated circuit formed by employing the symmetric inductor element 20 shown in FIG. 8 is described below.

Figure 13:
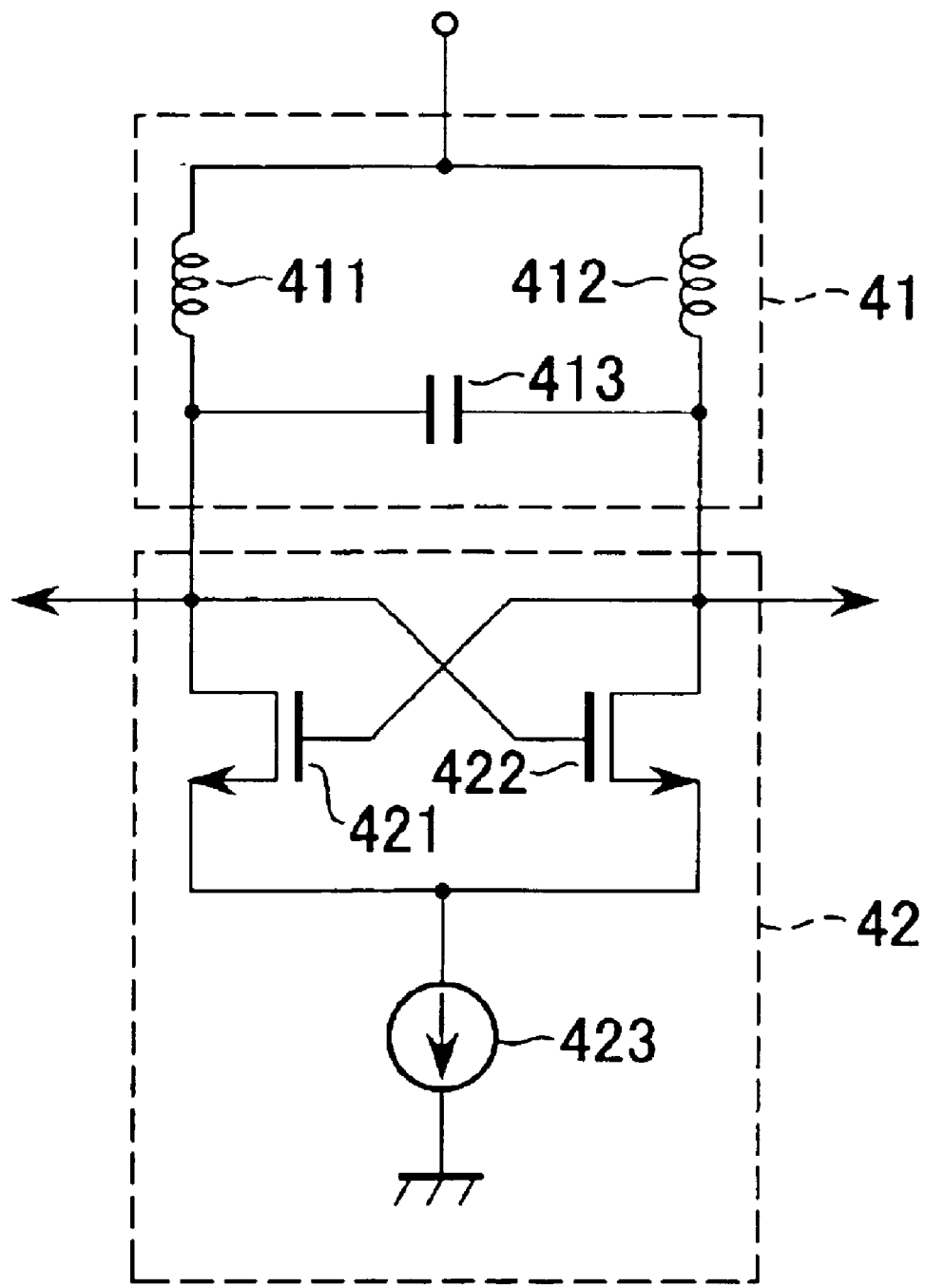
FIG. 13 is a schematic block diagram of an integrated circuit formed by employing the inductor element of the present invention.

FIG. 13 is a schematic block diagram for explaining an oscillating circuit 40, an example of an integrated circuit that can properly be formed by employing the symmetric inductor element 20. As shown in FIG. 13, the above mentioned oscillating circuit 40 comprises a resonator 41 comprising a pair of inductor elements 411 and 412, and a capacitor 413, and a negative resistor 42 comprising a pair of field-effect transistors (FETs) 421 and 422, and a power-supply source 423.

In FIG. 13, a unit of the symmetric inductor element 20 is applied to the portions indicated by a pair of inductor elements 411 and 412 corresponding to the resonator 41. When the symmetric inductor elements are employed, if these inductor elements generate lower Q values, current will not be able to flow smoothly, and will generate substantial loss. This in turn necessitates negative resistance to compensate for the loss, thus requiring a large amount of current.

On the other hand, in the case of applying the inductor element of the present invention 20 having intersections 25, 26, 27, and 28 for allowing intersection of the first conductor 21 and the second conductor 22, current loss is minimized and higher Q values are generated. This enables current to flow through the inductor element 20 smoothly to absolutely minimize negative resistance value close to zero. Because of this reason, even when saving flow of current, it is possible to realize an integrated circuit capable of achieving aimed oscillation.

As described above, in the case of employing the inductor element of the present invention 20 for operating the oscillating circuit 40 shown in FIG. 13, even when saving flow of current, it is possible to form easily the oscillating circuit 40 capable of achieving a predetermined object and featuring higher performance and physical characteristics.

The above description has solely referred to the case of mounting the symmetric inductor element 20 on the oscillating circuit 40. However, not only the above oscillating circuit 40, but the symmetric inductor element of the present invention may also be loaded on a variety of differential circuits such as an amplifying circuit for example. And yet, even when the inductor element of the present invention is loaded on any kind of differential circuits, since the inductor element of the present invention minimizes current loss and generates higher Q values, it is possible to form an integrated circuit capable of precisely operating itself with saved current flow to achieve the predetermined object.

Figure 1:
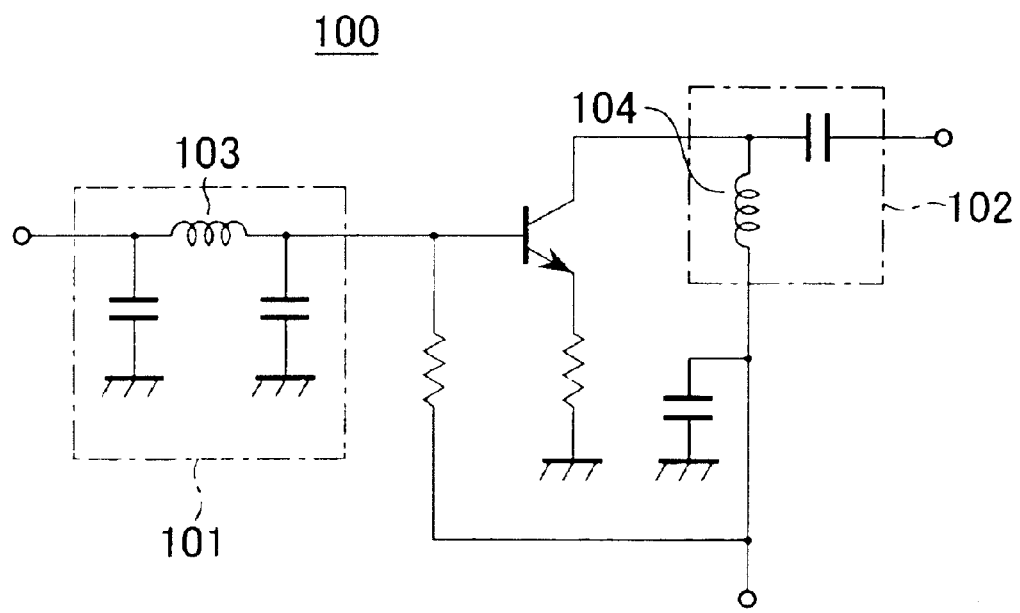
FIG. 1 is a schematic block diagram of a circuit for constituting an amplifier.
Figure 2:
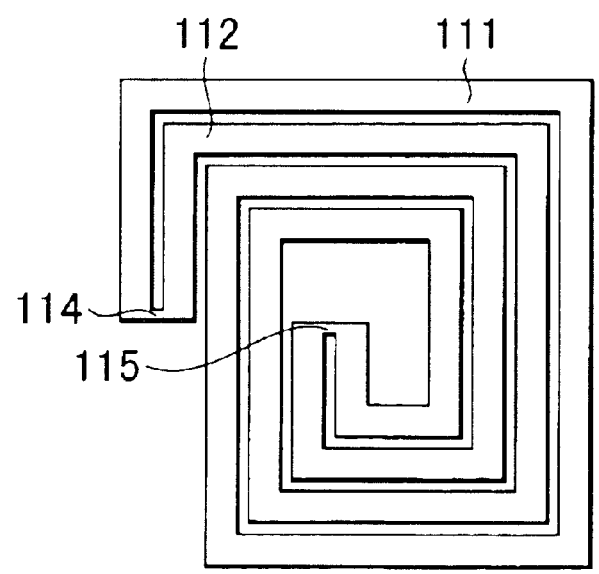
FIG. 2 is a view showing a constitution of a conventional inductor element.

In the case of the oscillating circuit 40 shown in FIG. 13, the symmetric inductor element 20 is employed. However, instead of employing the symmetric inductor element 20, it is also possible to employ the early described inductor element 10 of the first embodiment of the present invention shown in FIG. 4 for constituting matching circuits 101 and 102 of the amplifier 100 shown in FIG. 1.

In a case of applying the inductor element 10 of the present invention to form the matching circuits 101 and 102 of the amplifier 100, it is possible to minimize current loss in the matching circuits 101 and 102. Further, it is also possible for the amplifier 100 itself to gain sufficient amplification and minimize noise index. In other words, it is possible to form an amplifier featuring high gain and minimum noise index.

As described above, employment the inductor elements of the present invention 10 and 20 has made possible to easily form an integrated circuit featuring extremely high physical characteristics, which has not been available in conventional technique.

It will be apparent to those skilled in the art that various modifications can be made to the inductor device according to the present invention without departing from the scope and spirit of the present invention.

In the first embodiment of the present invention described earlier, an intersection for allowing the first and second conductors 11 and 12 to intersect each other is formed in the inductor element 10. On the other hand, in the second embodiment of the present invention, since the inductor element 20 is symmetrically formed, four of the intersections are provided to allow the first and second conductors 21 and 22 to intersect each other. However, the scope of the present invention is not solely limited to the above configuration, but it is also allowable to properly adjust the number and the location of the formable intersections in proportion to the aspect of the inductor elements.

The above-referred VIA 16 and VIA 17 used for causing the first and second conductors 11 and 12 to intersect each other are respectively made from tungsten (W), which generates a resistance value higher than that of the first and second conductors 11 and 12 made from aluminum (Al) or copper (Cu). Because of this, in a case of forming the intersections by employing the VIA 16 and VIA 17 made from tungsten (W), in order to prevent resistance value of the inductor element 10 from rising more than the required level, it is preferred to restrict the number of the intersections within minimum requirement.

Accordingly, in the case of forming the inductor element 10 or 20 of the present invention for actually loading on an integrated circuit, it is essential to initially consider configuration of the inductor element to be formed, the number of turns of winding conductors, and other requirements, and then execute simulation in the electromagnetic field before determining most suitable positions and number of the intersections to be formed. After determining the above requisites, it is possible to form an inductor element incorporating higher grade and performance capability fit for achieving the predetermined objects.

The above description has referred to the utilization of a pair of conductors including the first and second conductors 11 and 12 in the preceding first embodiment of the present invention, in which the first and second conductors 11 and 12 are aligned in parallel and arranged to intersect each other at a predetermined position. However, the scope of the present invention is not solely limited to the above arrangement. For example, the present invention is also applicable to a case in which more than two of the conductors may also be aligned in parallel to each other and arranged to intersect each other at predetermined positions as well.

What is claimed is:

1. An inductor element having a plurality of conductors formed on a surface of a substrate thereof to be helically wound within a plane surface in mutually parallel relationship, which is utilized on a high-frequency path for allowing high frequency current of an identical phase to flow through said plurality of conductors;

wherein, said plurality of conductors intersect themselves at a predetermined position so that inner positions and outer positions of said plurality of conductors are replaced with each other; and said predetermined position for allowing said plurality of conductors to intersect is selected so that individual length of said plurality of conductors are substantially equal;

whereby said plurality of conductors extend from a common first terminal to a common second terminal and have no conductors positioned between them.

2. The inductor element according to claim 1, wherein said plurality of conductors provided for said inductor element comprise a pair of conductors.

3. The inductor element according to claim 1, wherein said plurality of conductors provided for said inductor element comprise two pairs of conductors, wherein said two pairs of conductors are adjacent to each other; said two pairs of conductors intersect themselves on a predetermined line and are helically wound;

wherein each pair of conductors intersects each other at a symmetrical position with regard to said predetermined line.

4. An integrated circuit comprises an inductor element having a plurality of conductors formed on a surface of a substrate thereof to be helically wound within a plane surface in mutually parallel relationship, which is utilized as a high-frequency path for allowing high frequency current of an identical phase to flow through said plurality of conductors;

wherein, said inductor element having said plurality of conductors intersect themselves at a predetermined position so that inner positions and outer positions of said plurality of conductors are replaced with each other;

whereby said plurality of conductors extend from a common first terminal to a common second terminal and have no conductors positioned between them.

5. The integrated circuit according to claim 4, wherein said plurality of conductors provided for said inductor element comprise a pair of conductors.

6. The integrated circuit according to claim 4, wherein said plurality of conductors provided for said inductor element comprise two pairs of conductors;

wherein said two pairs of conductors are adjacent to each other; said two pairs of conductors intersect themselves on a predetermined line and are helically wound;

wherein each pair of conductors intersects each other at a symmetrical position with regard to said predetermined line.

* * * * *